US009331204B2

(12) United States Patent
Lue

(10) Patent No.: US 9,331,204 B2
(45) Date of Patent: May 3, 2016

(54) HIGH VOLTAGE FIELD EFFECT TRANSISTORS AND CIRCUITS UTILIZING THE SAME

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/209,011

(22) Filed: Mar. 13, 2014

(65) Prior Publication Data

US 2015/0263173 A1 Sep. 17, 2015

(51) Int. Cl.
*H01L 29/78* (2006.01)
*H01L 29/10* (2006.01)

(52) U.S. Cl.
CPC ........ *H01L 29/7856* (2013.01); *H01L 29/1041* (2013.01); *H01L 29/7833* (2013.01); *H01L 29/7851* (2013.01)

(58) Field of Classification Search
CPC ............ H01L 29/7856; H01L 29/7833; H01L 29/1041; H01L 29/7851; H01L 29/785; H01L 29/66795; H01L 21/823431; H01L 27/1211; H01L 27/0924; H01L 21/823821; H01L 21/845; H01L 27/0886; H01L 21/823412; H01L 29/104
See application file for complete search history.

(56) References Cited

U.S. PATENT DOCUMENTS

| | | | | |
|---|---|---|---|---|
| 7,029,959 B1 * | 4/2006 | Yang | ..................... | H01L 29/785 257/E21.444 |
| 8,503,213 B2 | 8/2013 | Chen et al. | | |
| 2012/0182806 A1 * | 7/2012 | Chen | ................. | H01L 27/11573 365/185.17 |
| 2012/0187486 A1 * | 7/2012 | Goto | ..................... | H01L 29/785 257/347 |
| 2013/0234208 A1 | 9/2013 | Bramian et al. | | |
| 2014/0008733 A1 * | 1/2014 | Shrivastava | ..... | H01L 21/823807 257/401 |
| 2014/0035619 A1 * | 2/2014 | Zaitsu | .............. | H03K 19/17764 326/41 |
| 2014/0210009 A1 * | 7/2014 | Xiao | ................. | H01L 29/66795 257/365 |
| 2015/0035586 A1 * | 2/2015 | Weis | .................... | H03K 17/687 327/436 |

OTHER PUBLICATIONS

Jang et al., "Vertical Cell Array using TCAT (Terabit Cell Array Transistor) Technology for Ultra High Density NAND Flash Memory," 2009 Symposium on VLSI Technology, Jun. 16-18, 2009, pp. 192-193.
Katsumata et al., "Pipe-shaped BiCS Flash Memory with 16 Stacked Layers and Multi-Level-Cell Operation for Ultra High Density Storage Devices," 2009 Symposium on VLSI Technology, Jun. 16-18, 2009, pp. 136-137.

(Continued)

*Primary Examiner* — Yasser A Abdelaziez
*Assistant Examiner* — Farun Lu
(74) *Attorney, Agent, or Firm* — Haynes Beffel & Wolfeld LLP

(57) ABSTRACT

A high-voltage circuit is described that comprises a high-voltage finFET can have a semiconductor fin with an insulating cap on the fin. A gate dielectric is disposed on the first and second sides of the fin. A gate overlies the gate dielectric and a channel region in the fin on the first and second sides, and over the cap. Source/drain terminals are disposed on opposing sides of the gate in the fin, and can include lightly doped regions that extend away from the edge of the gate to more highly doped contacts. The dimensions of the structures can be configured so that the transistor has a breakdown voltage of 30 V or higher.

23 Claims, 11 Drawing Sheets

(56) References Cited

OTHER PUBLICATIONS

Khazhinsky et al., "Study of Undoped Channel FinFETs in Active Rail Clamp ESD Networks," 2008 IEEE International Reliability Physics Symposium (IRPS 2008), Apr. 27-May 1, 2008, pp. 262-269.

U.S. Appl. No. 13/772,058, entitled "3D NAND Flash Memory,", filed Feb. 20, 2013, 70 pages.

* cited by examiner

HOW DEEP IS n+ CONTACT?

HIGH VOLTAGE FIELD EFFECT TRANSISTORS AND CIRCUITS UTILIZING THE SAME

BACKGROUND

1. Field of the Invention

The present invention relates to high voltage integrated circuits.

2. Description of Related Art

Some integrated circuits require high voltage transistors. For example 3D flash memory devices have been developed that can require circuits to apply high magnitude voltages during program and erase operations. For example, the maximum operation voltage for word lines can be about 22 to 24V for most NAND Flash memories. The large maximum programming voltage is to ensure slow cells can be correctly programmed to the maximum high threshold state, where for multilevel cells the verify voltage corresponding to the maximum high threshold state is higher than Vt=3V. In order to allow 24V to pass through a high voltage NMOS device to a word line, the gate voltage must provide sufficient gate over drive to allow easy pass through of the word line voltage. The necessary gate voltage (Vpp) can be 5V higher than the word line voltage, leading to a gate voltage requirement of greater than 29V. The large gate over drive is to compensate body effect phenomenon the source of the NMOS is raised to the word line voltage. So a voltage path is needed that can support very high junction breakdown voltages.

High voltage CMOS transistors have been deployed for these purposes, which can require significant layout area on the chip. A representative high-voltage MOSFET used in NAND flash memory can require planar transistor with the channel width of about 2μ, a channel length of about 1.2μ, spacing for offset between gate polysilicon and n+ source/drain terminals of the transistor more than 0.6μ, and shallow trench isolation STI structures having widths on the order one micron. If the channel width is too small, breakdown degradation is experienced. The n+ source/drain junction can be affected by the corner of the STI structure. As a result, the semiconductor on the edge of the structure is often implemented with a heavier P-type doping to avoid parasitic sidewall turn on leakage. Additional space is required between the source/drain terminals and the STI structure because of the heavier p-type doping along the edge. The spacing between the STI structures is limited by the field isolation requirement. For NAND flash with the 25 V programming bias, the STI spacing needs to sustain the difference between the program voltage on one word line and the pass voltage on an adjacent word line, which can be on the order of 15 V. The channel length is limited by high voltages punch through requirements. A drain offset between the source/drain terminal and the polysilicon gate has to be implemented to suppress gate induced drain leakage and gate breakdown.

All of these spacing requirements contribute to a very large layout requirement for high-voltage circuits of this type designed to operate at 30 Volts or more on an integrated circuit. In a representative implementation, a planar high-voltage CMOS circuit can require a 3μ, pitch (device to device spacing) for layout of high-voltage transistors designed for breakdown potentials greater than 30 V.

Also, 3D memory often has large word line resistance/capacitance RC delay. As a result, such devices can require more partitions of the memory array on the chip to reduce the size of individual word lines. High voltage drivers are needed for each of the partitions. As a result, the CMOS word line driver area can consume a very significant part of the die size.

It is desirable to provide high voltage circuits suitable for use in 3D memory and other high voltage integrated circuits that reduce the total layout area required without sacrificing performance and reliability.

SUMMARY

A high-voltage circuit is described that comprises a high-voltage finFET. Embodiments are described that are configured for breakdown voltages greater than 30 V. In embodiments described herein, the breakdown voltage is sufficient to withstand high gate overdrive potentials used to deliver a high voltage through the finFET to a circuit element like a word line, on an integrated circuit.

A high-voltage finFET as described herein comprises a semiconductor fin. A gate dielectric is disposed on the first and second sides of the semiconductor fin. A gate overlies a channel region in the fin over the gate dielectric on the first and second sides. An insulating cap can be disposed on the top of the fin. Source/drain terminals are disposed in the fin on opposing sides of the gate, and can include lightly doped regions that extend at least 0.5μ, away from the edge of the gate to more highly doped contacts. The high-voltage finFET can be configured by choice of dimensions and materials, so that the transistor has a breakdown voltage of 30 V or higher.

A plurality of such transistors can be implemented for example, having a horizontal pitch (taken across the fin in the dimension orthogonal to the channel length) on the order of 0.5μ. This can result in a reduction by six times the amount of horizontal pitch required for layout of the high-voltage circuits. A vertical pitch can be on the same order as used for planar devices as it is a less critical dimension in many implementations, such as in some driver circuits for 3D flash devices.

The fin can extend out of a substrate, and have a width in the channel region on the order of 50 nm. A lower portion of the fin abuts an insulating material such as silicon dioxide STI structures on opposing sides. An upper portion of the fin includes the channel and is covered by the gate dielectric. The STI can have a depth abutting the lower portion of the fin on the order of 500 nm, while the upper portion of the fin can have a height on the order 500 nm for a total fin height on the order one micron.

The insulating cap is configured by choice of materials and thickness, to suppress high-intensity fringing fields between the gate and the channel structure at the corners.

In the region at which the fin intersects the substrate, the doping concentration can be increased to suppress leakage caused by parasitic transistors in the substrate between the source/drain terminals in the fins.

An integrated circuit is described that includes a memory array. Peripheral circuits in the integrated circuit, such as a word line driver circuits configured to provide word line voltages to selected word lines in the array, can include high-voltage transistors. For example, a word line driver circuit can include level shifting circuits that provide programming voltages, including programming voltages having magnitudes higher than 20 V, in at least one state and lower voltages, such as ground in other states. Switches at the outputs of the level shifters can comprise high-voltage transistors as described above.

The peripheral circuits as described herein can be disposed between blocks of memory cells in a 3D structure, resulting in implementations that consume much less layout area than required by prior art devices.

Other aspects and advantages of the present invention can be seen on review of the drawings, the detailed description and the claims, which follow.

DETAILED DESCRIPTION

A detailed description of embodiments is provided with reference to the FIGS. 1-14.

Figure 1:
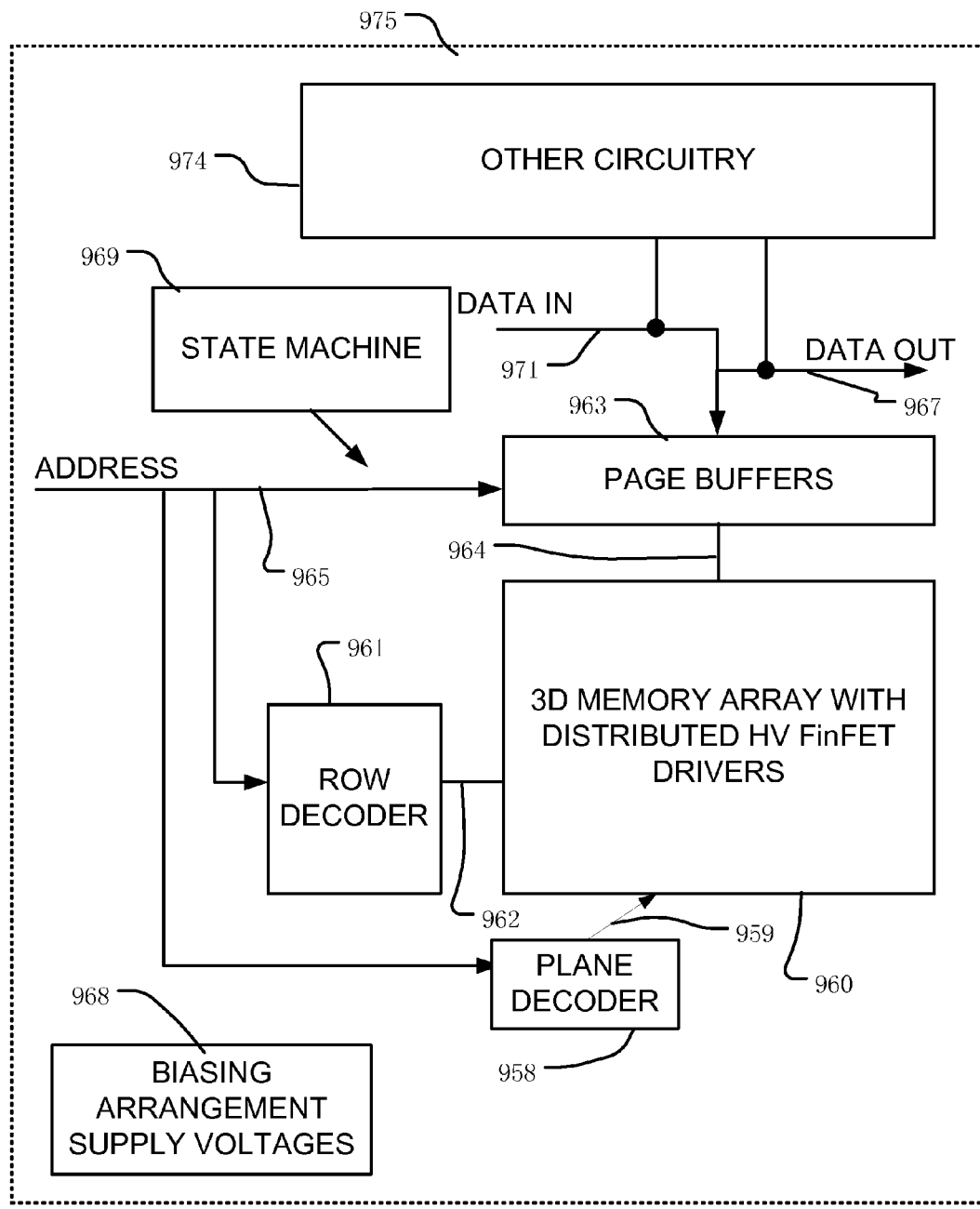
FIG. 1 is a block diagram of an integrated circuit including a 3D memory with distributed high voltage circuits in the array.

FIG. 1 is a simplified chip block diagram of an integrated circuit 975 including distributed high-voltage finFET driver circuits in a 3D memory. The integrated circuit 975 includes a 3D memory array 960 on an integrated circuit substrate.

A row decoder 961 including high-voltage drivers is coupled to a plurality of global word lines 962, and arranged along rows in the memory array 960 to distributed high voltage finFET switches in the array region. A plane decoder 958 is coupled to a plurality of select lines 959. A page buffer 963 in this example is coupled to a plurality of bit lines 964 arranged along columns in the memory array 960 for reading data from and writing data to the memory array 960. Addresses are supplied on bus 965 to page buffer 963, plane decoder 958 and row decoder 961. The page buffers 963 are coupled to data-in circuits and data-out circuits via lines 971 and 967.

Other circuitry 974 can be included on the chip to support mission functions, and utilize the memory. Control logic 969, including a state machine for example, or other control circuits, controls the application of supply voltages generated or provided through the voltage supply or supplies in block 968, such as read, verify and program voltages.

The control logic 974 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

High voltages generated in the block 968 are driven using circuits that include high voltage transistors, including high voltage finFETs as described herein.

Figure 2:
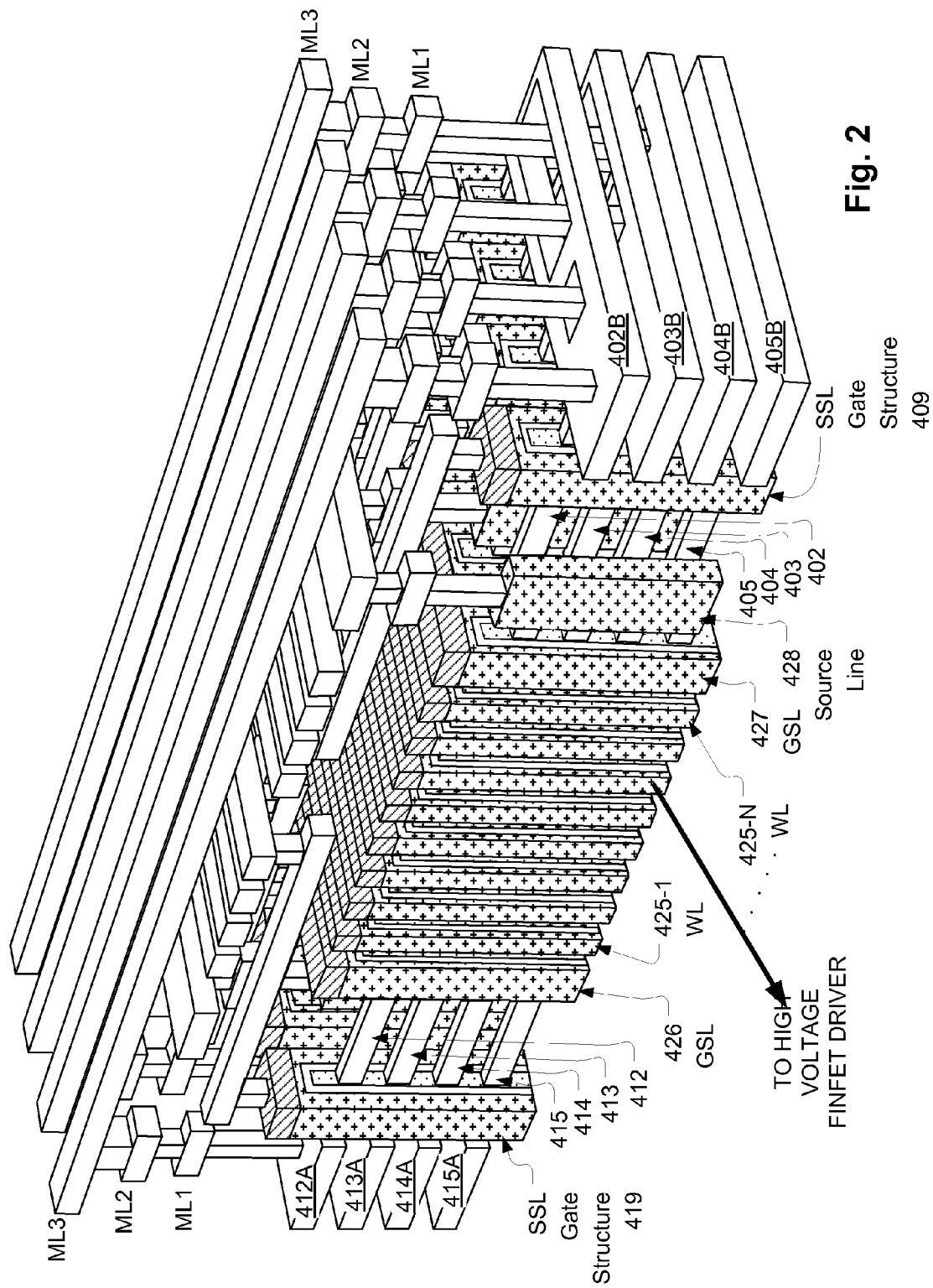
FIG. 2 is a perspective illustration of a 3D NAND-flash memory array structure connected to high voltage finFET drivers as described herein.

FIG. 2 is a perspective illustration of a 3D vertical gate (3DVG) NAND-flash memory array structure used with variants of the high voltage driver technology. The 3D NAND-flash memory array structure is described in commonly owned U.S. patent application Ser. No. 13/078,311 filed 1 Apr. 2011, entitled "Memory Architecture of 3D Array With Alternating Memory String Orientation and String Select Structures," now U.S. Pat. No. 8,503,213, which is hereby incorporated by reference as if fully set forth herein. Insulating material is removed from the drawing to expose additional structure. For example, insulating layers are removed between the semiconductor strips, in the ridge-shaped stacks, and are removed between the ridge-shaped stacks of semiconductor strips. The 3D NAND-flash memory array structure includes stacked memory structures resulting in the array having a plurality of memory cells disposed in a dense configuration.

The multilayer array is formed on an insulating layer, and includes a plurality of word lines 425-1, . . . , 425-N. The plurality of ridge-shaped stacks includes semiconductor strips (e.g. strips 412, 413, 414, 415 in the first even page stack). The stack of semiconductor strips 412, 413, 414, 415 is terminated at one end by the stairstep pads 412A, 413A, 414A, 415A, and passes through SSL gate structure 419, gate select line GSL 426, word lines 425-1 WL through 425-N WL, ground select line GSL 427, and terminates at the other end by source line 428. The stack of semiconductor strips 412, 413, 414, 415 does not reach the stairstep pads 402B, 403B, 404B, 405B.

The stack of semiconductor strips 402, 403, 404, 405 in the first odd page stack, is terminated at one end by the stairstep pads 402B, 403B, 404B, 405B, and passes through SSL gate structure 409, gate select line GSL 427, word lines 425-N WL through 425-1 WL, ground select line GSL 426, and terminates at the other end by a source line (obscured by other parts of the figure). The stack of semiconductor strips 402, 403, 404, 405 does not reach the stairstep pads 412A, 413A, 414A, 415A.

The word lines 425-1 to 425-N are connected to high voltage driver circuits needed to support programming and erasing operations.

Stairstep pads 412A, 413A, 414A, 415A terminate semiconductor strips in even pages, such as semiconductor strips 412, 413, 414, 415. As illustrated, these stairstep pads 412A, 413A, 414A, 415A are electrically connected to different bit lines for connection to decoding circuitry to select planes within the array. These stairstep pads 412A, 413A, 414A, 415A can be patterned at the same time that the plurality of ridge-shaped stacks are defined.

Stairstep pads 402B, 403B, 404B, 405B terminate semiconductor strips in odd pages, such as semiconductor strips 402, 403, 404, 405. As illustrated, these stairstep pads 402B, 403B, 404B, 405B are electrically connected to different bit lines for connection to decoding circuitry to select planes within the array. These stairstep pads 402B, 403B, 404B, 405B can be patterned at the same time that the plurality of ridge-shaped stacks are defined.

Any given stack of semiconductor strips is coupled to either the stairstep pads 412A, 413A, 414A, 415A on one end of the block, or the stairstep pads 402B, 403B, 404B, 405B on the other end of the block, but not both.

Ground select lines GSL 426 and GSL 427 are conformal with the plurality of ridge-shaped stacks, similar to the word lines.

Every stack of semiconductor strips is terminated at one end by a set of stairstep pads, and at the other end by a source line. For example, the stack of semiconductor strips 412, 413, 414, 415 is terminated at one end by stairstep pads 412A, 413A, 414A, 415A, and terminated on the other end by source line 428. At the near end of the figure, every other stack of semiconductor strips is terminated by the stairstep pads 402B, 403B, 404B, 405B, and every other stack of semiconductor strips is terminated by a separate source line. At the far end of the figure, every other stack of semiconductor strips is terminated by the stairstep pads 412A, 413A, 414A, 415A, and every other stack of semiconductor strips is terminated by a separate source line.

Bit lines and string select lines are formed at the metals layers ML1, ML2, and ML3. Local bit lines for each string of memory cells are formed by the semiconductor strips.

Memory cell transistors are formed with memory material between the semiconductor strips and the word line 425-1. In the transistors, the semiconductor strip (e.g. 413) acts as the channel region of the device. SSL gate structures (e.g. 419, 409) are patterned during the same step in which the word lines 425-1 through 425-n are defined. A layer of silicide can be formed along the top surface of the word lines, the ground select lines, and over the gate structures. A layer of memory material can act as the gate dielectric for the transistors. These transistors act as string select gates coupled to decoding circuitry for selecting particular ridge-shaped stacks in the array.

The 3D structure shown in FIG. 2 is a 3D vertical gate structure (3DVG) representative of a variety of other memory array structures, including 2D and 3D arrays, for which high voltage driver circuits can be deployed. In other embodiments, 3D vertical channel (3DVG) structures can be used, implemented for example as described in my co-pending U.S. patent application Ser. No. 13/772,058, filed 20 Feb. 2013, entitled 3D NAND FLASH MEMORY, which is incorporated by reference as if fully set forth herein. Other 3D memory structures are suitable for use with the high voltage drivers described herein, as described for examples, in Jang et al., "Vertical cell array using TCAT (Terabit Cell Array Transistor) technology for ultra high density NAND flash memory," VLSI Technology, 2009 Symposium, 16-18 Jun. 2009, Pages: 192-193; and Katsumata, et al., "Pipe-shaped BiCS flash memory with 16 stacked layers and multi-level-cell operation for ultra high density storage devices," VLSI Technology, 2009 Symposium, 16-18 Jun. 2009, Pages: 136-137.

Figure 3:
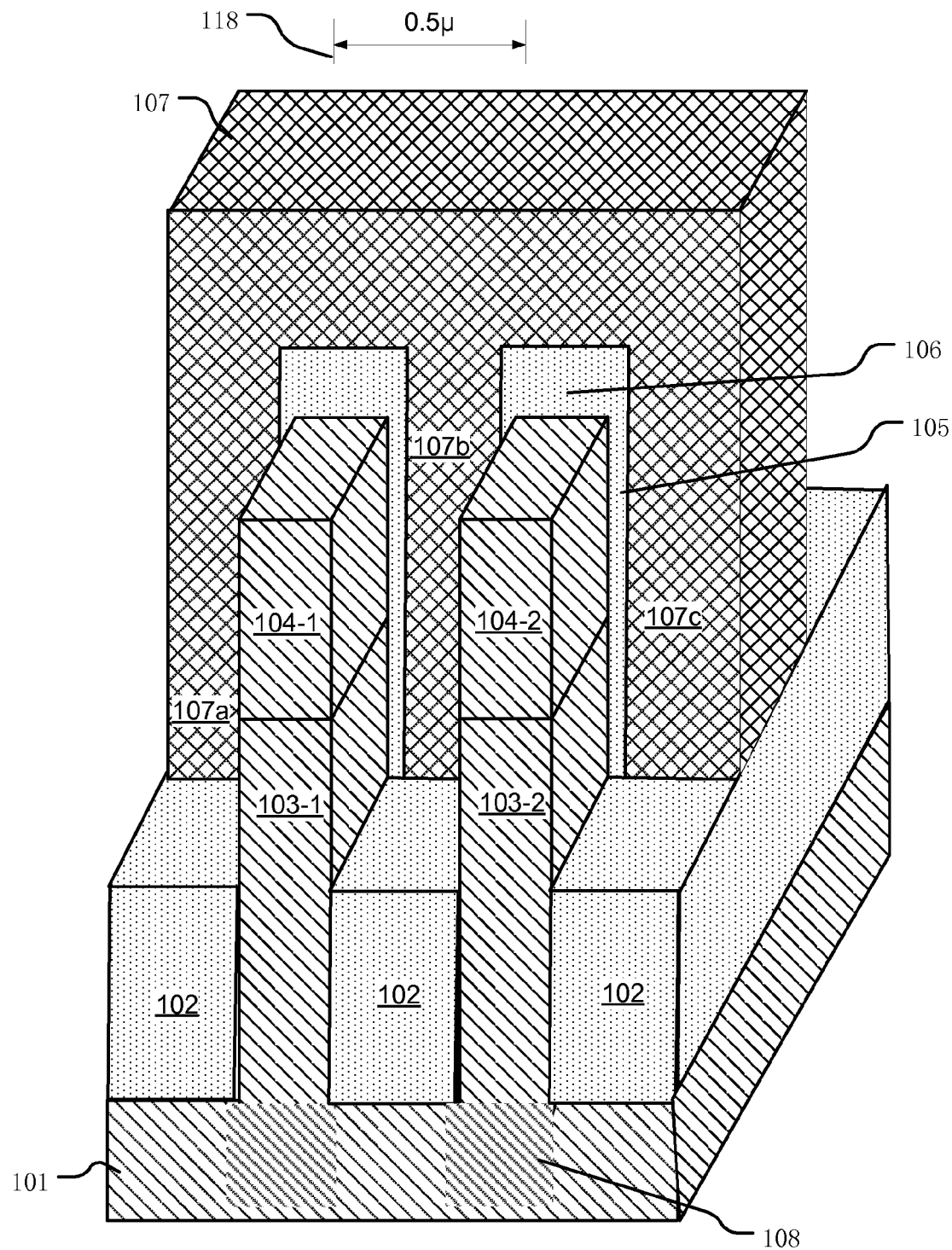
FIG. 3 is a perspective view of a pair of high-voltage finFET transistors.

FIG. 3 illustrates a pair of finFET, high-voltage MOSFET devices on an integrated circuit substrate 101. These devices can be utilized in peripheral circuits such as word line drivers in NAND flash integrated circuits requiring high voltage for program and erase operations. The use of the device is described herein can greatly reduce the layout area required for high-voltage circuits resulting in aggressive area shrinkage for the word line driver circuits, for example. Also, this technology enables partitioning of word lines because many distributed high-voltage switches can be implemented in the array without too much area penalty. As a result, faster 3D NAND flash designs can be provided with divided word lines to improve word line setup speed.

Conventional high-voltage MOSFET devices have very large design rules in channel length, channel width and field isolation. For NAND flash memory, the maximum operation bias in some designs is nearly 30 V. Thus, a high-voltage MOSFET device of conventional design consumes substantial area. Utilizing the technology described herein, substantial area savings can be achieved.

A finFET can be configured for breakdown voltage greater than 30 V utilizing a tall fin height with deep insulating structure such as STI on the lower sides of the fin. Also, deep lightly-doped junctions for source/drain terminals in the fin can be implemented. The fin width on the other hand can be quite moderate.

A high-voltage gate oxide can be grown on the sidewalls of the fin to support high-voltage operation. At the top of the fin over the corners, a thick cap insulator, such as silicon dioxide 50 nm thick for example, having an effective oxide thickness (EOT) greater than that of the gate dielectric on the sides of the fins, can be implemented to avoid top corner reliability issues that result from field enhancement at corners.

As can be seen in FIG. 3, fins 103-1 and 103-2 extend from a relatively lightly doped, p-type substrate 101. Lower portions of the fins abut insulating material on both sides, such as shallow trench isolation STI structures on the order of 500 nm deep, such as 300 nm to 700 nm deep. A gate structure 107 overlies the fins 103-1, 103-2 having vertical extensions 107a, 107b, 107c on opposing sides of the upper portions of the fins. The gate structure 107 can comprise a doped polysilicon material. In some embodiments configured for n-channel operation, the gate structure 107 comprises a p+ doped polysilicon to achieve higher work function than n+ polysilicon. In yet other embodiments, other high work function conductive materials can be utilized. The gate length (width of the gate structure in the vertical pitch dimension over the length of the channel in the fin) is also selected to support high-voltage operation, and can be greater than 0.5μ, including embodiments with gate lengths greater than one micron, for breakdown voltages greater than 30 V.

The height of the fin between the lower ends of the vertical extensions 107a-107c of the gate (e.g. at the top surface of the STI structures 102) and the top of the fin can be on the order of 500 nm, such as 300 to 700 nm. This results in an overall fin height from the bottom of the insulating structure 102 to the top of the fin near the cap 106 of about one micron. These dimensions are selected according to a configuration of the device, along with other materials and dimensions, to achieve specified breakdown voltages, including breakdown voltages of 30 V or higher, and to provide sufficient current carrying capability for the target application of the device.

A gate dielectric 105 such as silicon dioxide having a thickness on the order of 40 nm, is disposed between the vertical extensions 107a, 107b, 107c of the gate and the channel region in the fin, having a material and thickness selected to support high-voltage operation.

The fin width is also configured for high voltage operation, and can be quite moderate. In examples configured for breakdown voltages of 30 V or more, the fin width can be in a range from about 30 to 70 nm.

FIG. 3 illustrates lightly doped n-type regions 104-1, 104-2 in each of the fins 103-1, 103-2. The lightly doped regions 104-1, 104-2 extend from the channel region which lies below the gate structure 107 to a more highly doped contact (not shown) for the source/drain terminal. The width of the lightly doped region is also configured to support high voltage operation, and can be on the order of 0.5μ, or more, such as 0.7μ, for embodiments with breakdown voltages over 30 V. The depths of the lightly doped regions 104-1, 104-2 can be on the order of 200 nm, or more. In embodiments of the structure, the lightly doped regions 104-1, 104-2 do not extend into the fin to a level at or below the upper surface 109 of the insulator 102. In examples configured for breakdown voltages greater than 30 V, the depths of the lightly doped regions 104-1, 104-2 can be for example in the range from 150 to 400 nm.

The high-voltage transistors illustrated in FIG. 3 are dual-gate structures having a channel width on each side of the fin on the order 500 nm, for a combined channel width of about one micron in some examples that are configured for breakdown voltages greater than 30 V.

Also illustrated in FIG. 3 are regions 108 in the substrate 101 that are more heavily doped with p-type material than the fin, and than the underlying substrate. This suppresses turn-on of parasitic NPN devices between the source/drain terminals of adjacent finFETs. In the illustrated structure, embodiments can be used in which there is no need for field implants around the edge of the STI structures as required in planar MOSFETs. The active region of the fin is not significantly affected by the STI edge and is essentially free of the STI edge effect of the planar MOSFET. The depth of the STI structure can be adjusted for better field isolation as required for particular implementations, particularly when configuring the device for operation with breakdown voltages greater than 30 V. Inside the upper portion of the fin, doping can be very low for the finFET, resulting in a higher breakdown margin than that of a planar high-voltage MOSFET. The lightly doped drain regions have depths which result in a significant space between the STI surface and the doped region, and are thus not affected by the STI edge, resulting in a device that is more robust against STI edge degradation. This allows aggressive fin pitch scaling, while maintaining high-voltage operation.

In the layout for the device shown in FIG. 3, the horizontal pitch 118 can be on the order of 0.5μ when configured for breakdown voltages of 30 V or more.

Figure 4:
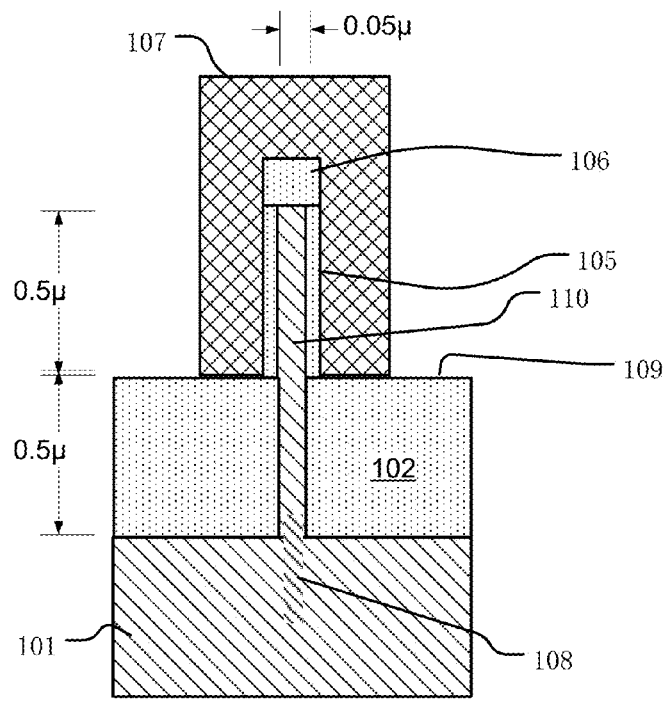
FIG. 4 is a cross-section view across the fin (horizontal pitch dimension) of a high-voltage finFET transistor.

FIG. 4 is a cross-section of a high-voltage finFET device along the gate structure through the channel region. Reference numerals used in FIG. 3 are used in FIG. 4 for like structures. Thus, the substrate 101 includes a more highly doped region 108 at the base of fin 110. The fin includes a first portion which abuts the STI structure 102 which can be on the order of 0.5μ deep. Also, the fin 110 includes an upper portion having a height on the order of 0.5μ above the STI structure 102, which is surrounded by the gate structure 107. A gate dielectric 105 lines opposing sides of the fin. An insulating cap 106 is formed on the top of the fin 110 to reduce field enhancement effects. The width of the fin in the channel region can be on the order of 0.10μ, or 0.05μ as illustrated.

Figure 5:
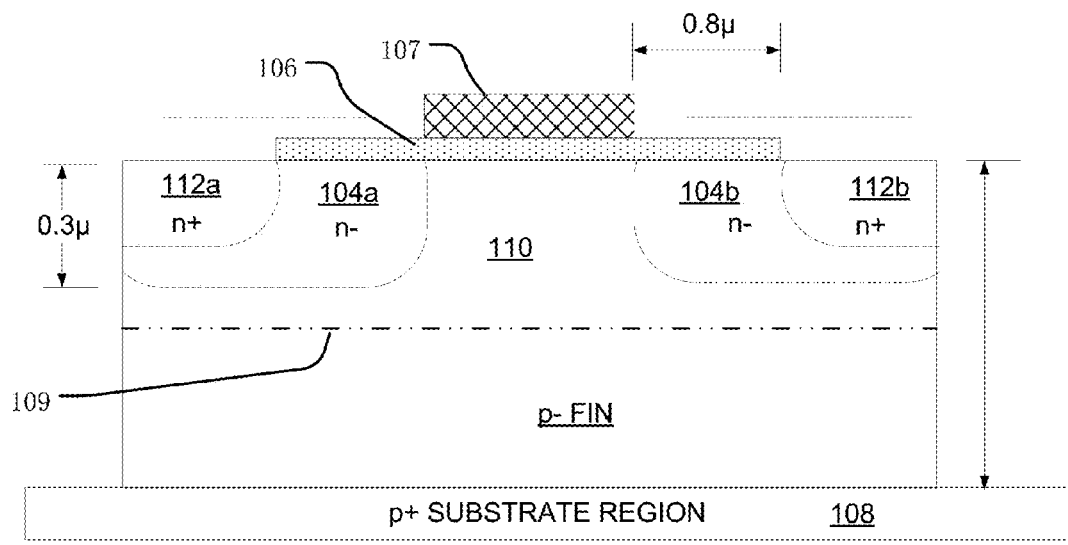
FIG. 5 is a cross-section view along the fin (vertical pitch dimension) of a high-voltage finFET transistor.

FIG. 5 is a cross-section of a high-voltage finFET device taken along the fin 110. Reference numerals used in FIG. 3 are used in FIG. 4 for like structures, where the dashed line 109 represents a top surface of the insulator 102 which is not represented in this cross-section. Thus, the substrate includes a more highly doped p+ region 108 where the more lightly doped P– fin 110 extends out of the substrate. Insulating cap 106 overlies the top of the fin 110. The gate structure 107 overlies the cap 106 in the channel region of the fin. Lightly doped regions 104a and 104b extend from the channel region outwardly in the vertical pitch dimension for about 0.8μ, and have depths less than the height of the fin above the surface 109 of the STI structure, and in this example about 0.3μ. More heavily doped source/drain terminals 112a, 112b are disposed in the fin 110 in regions spaced away from the gate 107 by the more lightly doped regions 104a and 104b to improve breakdown characteristics. Contacts (not shown) to overlying patterned conductors can be made in the more heavily doped regions. The typical heavy-doped N+ junction depth for the source/drain terminals 112a, 112b can be a few hundred of Angstrom, such as 50 nm. Light-doped N– junction depth in regions 104a and 104b can be much deeper (>200 nm) to sustain the breakdown voltage.

Figure 6:
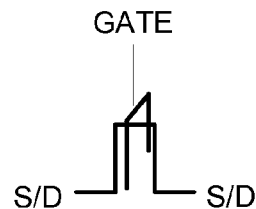
FIG. 6 illustrates a schematic symbol used to represent high-voltage finFET transistors as described herein, in FIG. 7.

FIG. 6 is a symbol utilized in circuit diagrams which represents the high-voltage finFET described herein, with source/drain terminal S/D and a gate GATE.

Figure 7:
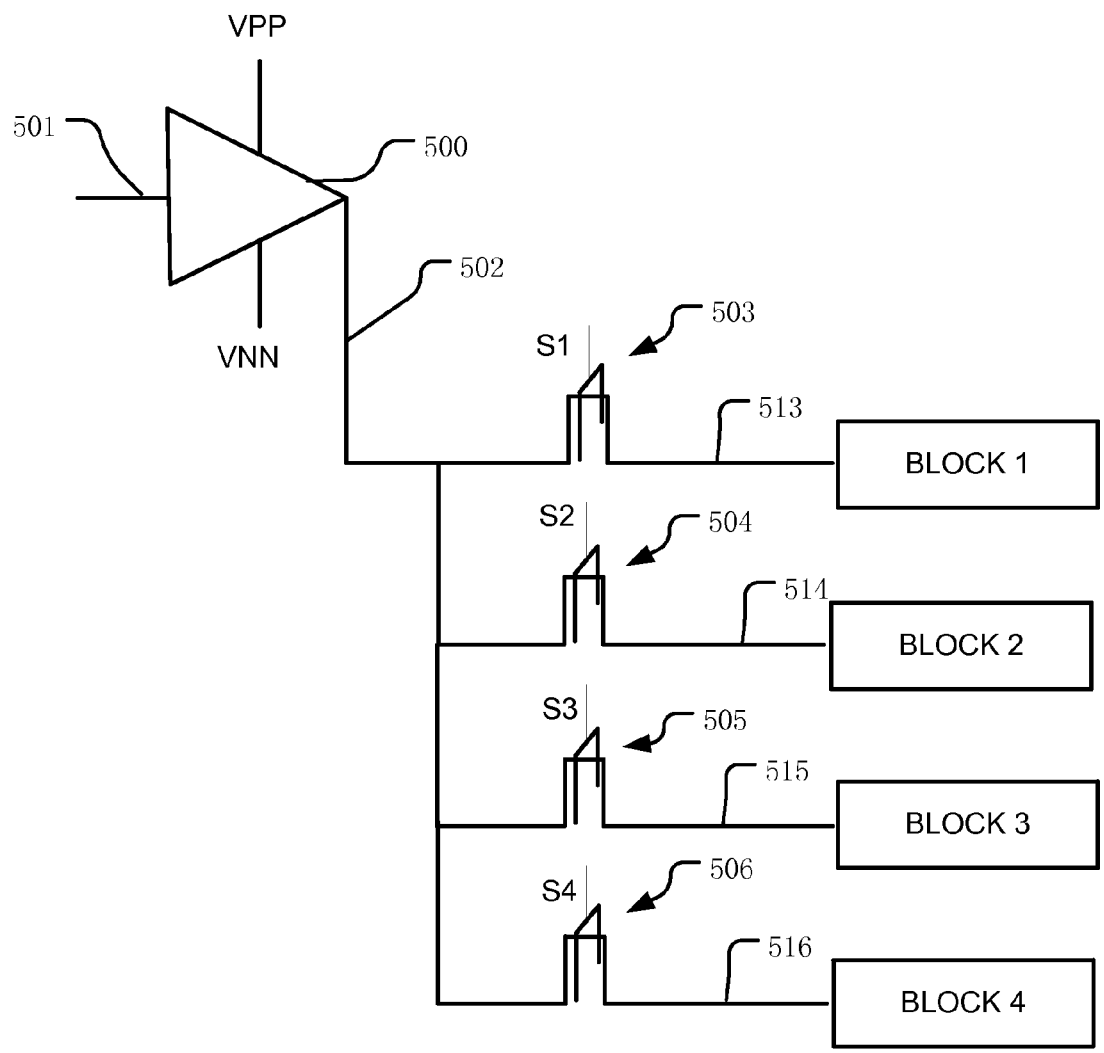
FIG. 7 is a simplified schematic diagram of circuitry utilizing high-voltage finFET transistors as described herein.

FIG. 7 is a simplified diagram of a circuit including a source of high voltage connected to one terminal of a switch and a circuit element connected to another terminal of the switch, in which the switch is a high voltage finFET. The circuit in FIG. 7 is a word line driver in a memory device. The word line driver in this example includes a level shifter 500 which receives a control signal on its input 501, and outputs a high-voltage signal on line 502, which distributes the high voltage to word line switches for word lines in a plurality of blocks of memory cells. The level shifter 500 is configured to shift the voltage on its input from the relatively low logic circuit voltages to a selected one of the a high positive voltages VPP, which can be a high magnitude positive voltage on the device, and a high negative voltage VNN, which can also be a high magnitude negative voltage on the device.

The output 502 is applied to switches 503-506 which are implemented using the high-voltage finFETs described herein, each having a gate voltage S1-S4 that is controlled to couple the voltage on line 502 to a word line 513-516 in a block of memory cells (BLOCK 1-BLOCK 4). In some circuits, the signals S1 to S4 can be the highest magnitude voltages on the device, because the transistors must be configured to pass the VPP and/or VNN voltages to the word lines.

In other embodiments, the high-voltage finFETs are arranged in circuits, such as latches, inverters or buffers configured to provide high voltage outputs.

Level shifter circuits 500 can also include high-voltage finFETs as described herein, used for example in switches that deliver high magnitude voltages to the output line 502.

The circuit in FIG. 7 is representative, more generally, of a circuit including a source of high-voltage (e.g. level shifter 500) and a high-voltage finFET (e.g. 503), configured for breakdown voltages of 30 V or more. Thus, the finFET has a high voltage coupled to one of the source/drain terminals or to the gate, or both, and a lower voltage coupled to the other of the source/drain terminals or the body, causing a high voltage electric field, or voltage drop, across the device which can lead to breakdown if the voltage is too high.

Figure 8:
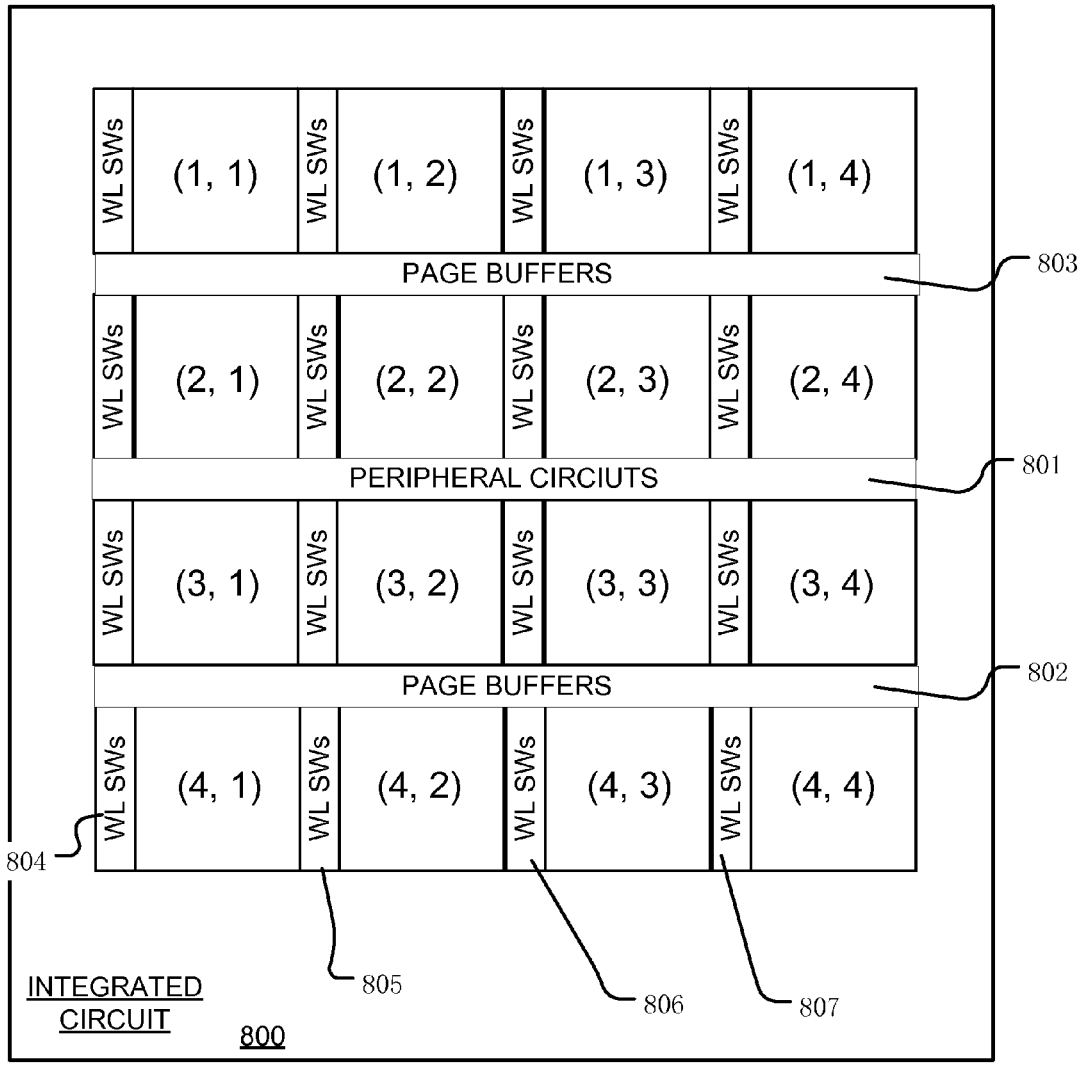
FIG. 8 is a simplified diagram of an integrated circuit memory including high-voltage finFET-transistor-implemented word line switches such as that shown FIG. 7.

FIG. 8 is a simplified diagram of an integrated circuit 800 that includes a plurality of memory blocks arranged in an array, including memory blocks (1,1), (1,2), . . . (4,4) with high-voltage finFETs distributed among the memory blocks. The memory blocks can comprise 3D blocks such as that shown in FIG. 2, or implemented using other 3D technologies. Regions between memory blocks include peripheral circuits which, in this example, include miscellaneous peripheral circuits 801 between the rows of blocks (2,1) to (2,4) and blocks (3,1) to (3,4). Also in this example page buffers 802, 803 are disposed between the rows of blocks (1,1) to (1,4) and blocks (2,1) to (2,4), and between the rows of blocks (3,1) to (3,4) and blocks (4,1) to (4,4). Word line switches (e.g. 804, 805, 806, 807) are disposed along one side of each of the blocks in the array of blocks. Word line switches can be implemented using high-voltage finFETs as described above with respect to FIG. 7, for example. Because of the small pitch of high-voltage finFET as described herein, implementation of the word line switches using such devices can save significant layout area on the integrated circuit 800. The smaller layout area for the high-voltage transistor enables the use of greater number of partitions of the memory array along high-voltage lines such as word lines. This can result in a much smaller RC delay and faster speed for high density memories.

Also, high-voltage finFETs as described herein can be utilized throughout the peripheral circuitry where high-voltage transistors are required.

Figure 9:
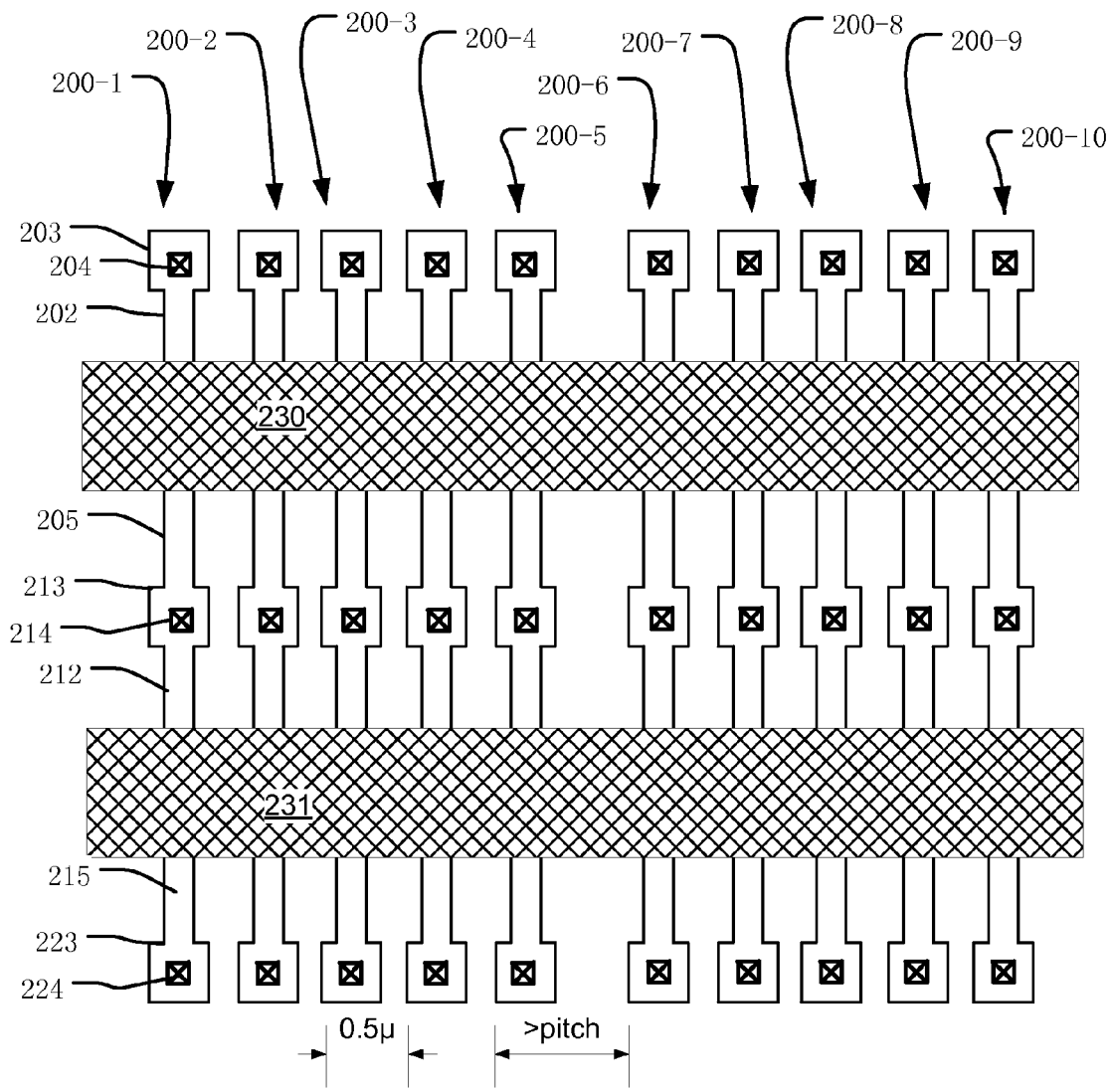
FIG. 9 is a layout view of a plurality of high-voltage finFET transistors.

FIG. 9 is a layout view of a plurality of high-voltage finFET transistors. The figure illustrates 10 fins 200-1 through 200-10, which are crossed by two gate structures 230, 231. As a result 20 high-voltage finFETs are implemented in the layout illustrated by the figure. Each of the fins 200-1 through 200-10 is laid out in the same pattern, of which fin 200-1 is representative.

Referring to fin 200-1, the fin includes a narrow portion which extends under the gate 230 and a narrow portion which extends under the gate 231, which form channel regions having widths on the order of 50 nm as described above. The fin doping can be very low (~1E16 cm-3 to 1E17 cm-3) without undue short channel effect or punch-through issues, as a consequence of the double gate finFET structure that offers better electrostatic performance and better gate control capability. It is expected as well that the finFETs will have a smaller body effect than that encountered in equivalent planar MOSFETs.

The depth of the STI structure is important for field isolation between adjacent finFETs if they may encounter different junction bias. If different junction bias is applied, then a parasitic N-P-N may be biased in a manner to turn on or punch through, between the fins. At the base of the fins, substrate doping can be increased slightly, such as to about twice or more times of the doping in the fin, which results in a higher N-P-N punch-through voltage, and suppresses turn-on of the parasitic device.

Lightly doped source/drain terminals are formed in the regions 202 and 205, which extend from the channel outwardly in the vertical pitch dimension while the fin maintains a constant width in this example, toward regions 203 and 213, respectively, in which contact can be made to the fins. The manufacturing process can apply the implants for the lightly doped regions (e.g., 1E17 cm-3 to 2E18 cm-3), after patterning the gates 230, 231, as is conventional in some CMOS processes with a depth on the order of 150 nm or more to sustain high voltage at the channel junction without breakdown. The regions 203 and 213 spaced away from the gates are wider than portions of the fin under the gates to accommodate interlayer contacts and reduce contact resistance. Also, lightly doped source/drain terminals are formed on opposing sides of the channel region under the gate 231 in the narrow regions 212, 215. The wider region 223 is disposed on the fin 200-1, and includes a source/drain contact 224. Source/drain contacts 204, 214, 224 are made in the wider regions 203, 213, 223, and include higher concentrations of n-type doping (for n-channel transistors) which can be applied as an implant relying on the patterning steps used to make vias for example used for the interlayer contacts 204, 214, 224. The length of the more lightly doped region, from the side of the gate to the wider portions in which the source/drain contacts 204, 214, 224 with the higher doping concentrations are implemented, can be more than 0.5μ to improve breakdown performance. This can result in spacing from the gate to the more highly doped regions in the fins of more than 0.6μ. The transition from the thin portion of the fin to the wider portions can be located near the gate, to reduce contact resistance as discussed below.

The layout in FIG. 9 illustrates the fin-to-fin horizontal pitch which can be from about 0.3μ to about 0.5μ for high-voltage operation as described herein. In configurations where greater concern for breakdown may exist, the pitch can be increased to greater than 0.5μ, such as illustrated between the fins 200-5 and 200-6 in FIG. 9.

The layout shown in FIG. 9 comprises transistors which share a contact (e.g. 214) between two parts of a single fin. In this example, the shared contact can be coupled to sources of high voltage such as a level shifter, while the opposing contacts (e.g. 203, 224) are coupled to word lines which can have low voltage as a result of preceding operation of the circuit. Overlying patterned conductors, such as patterned metal layers, can be used to connect the contacts (e.g. 203, 224) to corresponding word lines for example, or other features of an integrated circuit that require high voltage.

In order to deliver significant drive current, or saturated drain current of greater than 50 μA per fin, the fin height should be configured as described herein relatively large, on the order 400 to 700 nm. Because the finFET device is effectively configured as a double gate device, the fin height is proportional to be effective channel width, and therefore current carrying capability. In embodiments where higher current carrying capability is required, the high voltage finFETs can be configured in parallel.

In embodiments where a threshold voltage VT of an n-channel high-voltage finFET is too low, then a p-type polysilicon or other p-type material can be utilized for the gates 230, 231.

N-channel devices have been described so far and may be preferred for better breakdown performance. In order to implement p-channel devices, the doping polarities can be reversed, and the sizes of the structures scaled to account for the differing mobility of holes and electrons, and so on. It may be desirable to use both n-channel and p-channel devices on a single integrated circuit in order to configure CMOS circuit components like inverters, buffers and so on, which have high breakdown voltage.

P-channel devices can be implemented using the same basic dimensions as the n-channel devices described above, for use as a complement to the n-channel devices in implementation of circuits like latches, buffers and inverters that may be utilized in word line drivers for example. Because the drive current for a p-channel device is less than that of an n-channel device of the same size, multiple p-channel devices can be utilized in parallel as a complement to one or a smaller number of n-channel devices. Also, it may be desirable to configure the p-channel device for surface channel operation, rather than buried channel operation by eliminating or reducing the Vt adjustment implants. In conventional NAND Flash peripheral circuit, the PMOS devices are often buried-channel MOSFET. This is because N+ poly gate is used for both N-channel and P-channel MOSFET, whereas a lower-gate work function N+ gate for PMOS will results in too negative Vt. As a result, a counter doped (p-type) doping for N-well is often adopted to decrease the Vt of PMOSFET. The p-type Vt tuning doping at N-well will result in the buried-channel device, where subthreshold current starts beneath surface.

Figure 10:
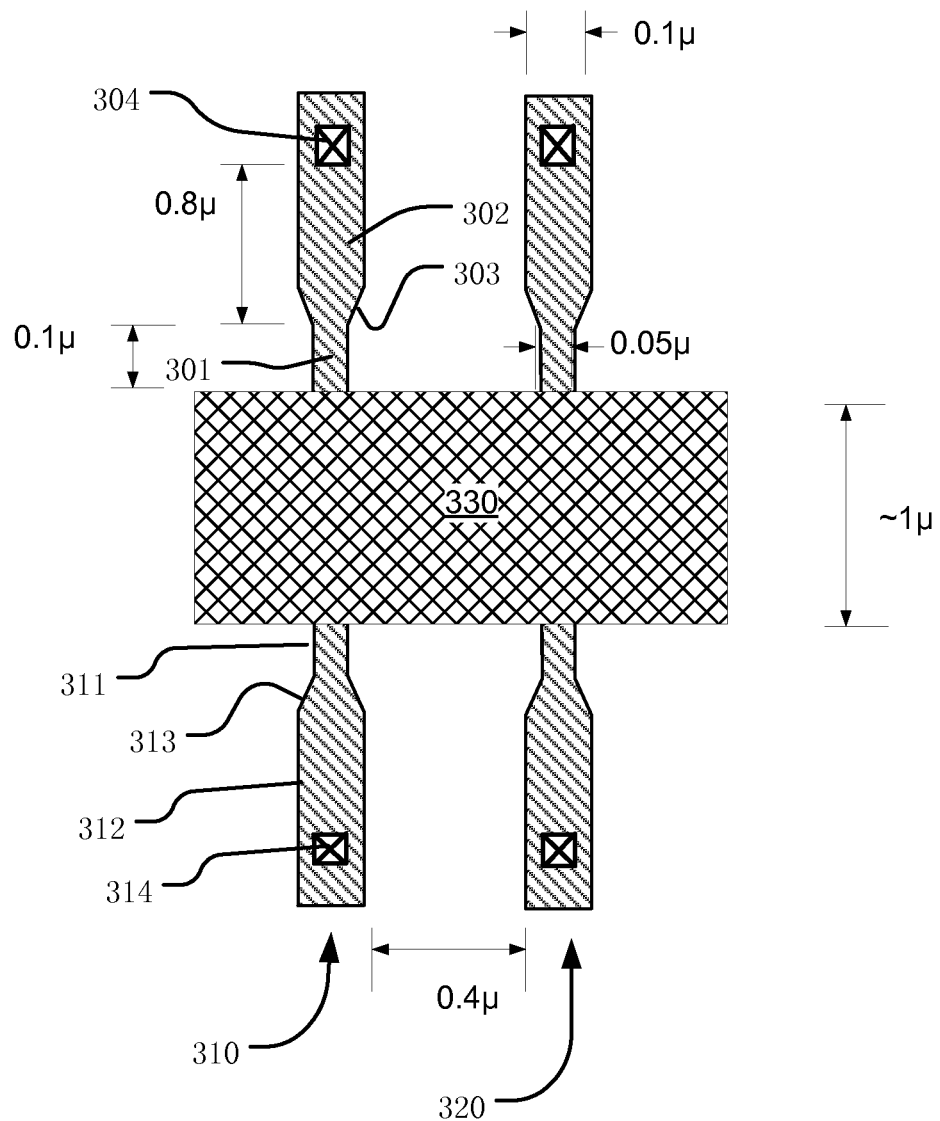
FIG. 10 is a layout view of an alternative configuration for high-voltage finFET transistors.

FIG. 10 illustrates an alternative layout for high-voltage finFETs which increase the width of the lightly doped drain region close to the polysilicon gate 230, before the transition to highly doped contact regions. Thus, the fin 310 and the fin 320 are illustrated. A gate 330 having width on the order of one micron overlies the fins and defines the channel region between the narrow portions 301 and 311 of the fin, which can be on the order of 0.05μ (50 nm). Transition regions 303, 313 expand the width of the fin to that of the wider regions 312, 302, which can be on the order of 0.1μ (100 nm) wide, for example. Interlayer contacts 304, 314 are positioned in the wider regions 302, 312 in locations spaced away from the gate by more than 0.6μ as described above. In this example, the spacing between the gate 330 edge and the transition region 303 is about 0.1μ the distance from the transition region to that interlayer contact 304 is about 0.8μ. This greater width of the fin in the region 302 results in lower resistance between the channel and the contact 304. Lower resistance in the LDD region can increase the drain current in the saturated condition, and be beneficial for some applications of the device.

Figure 11:
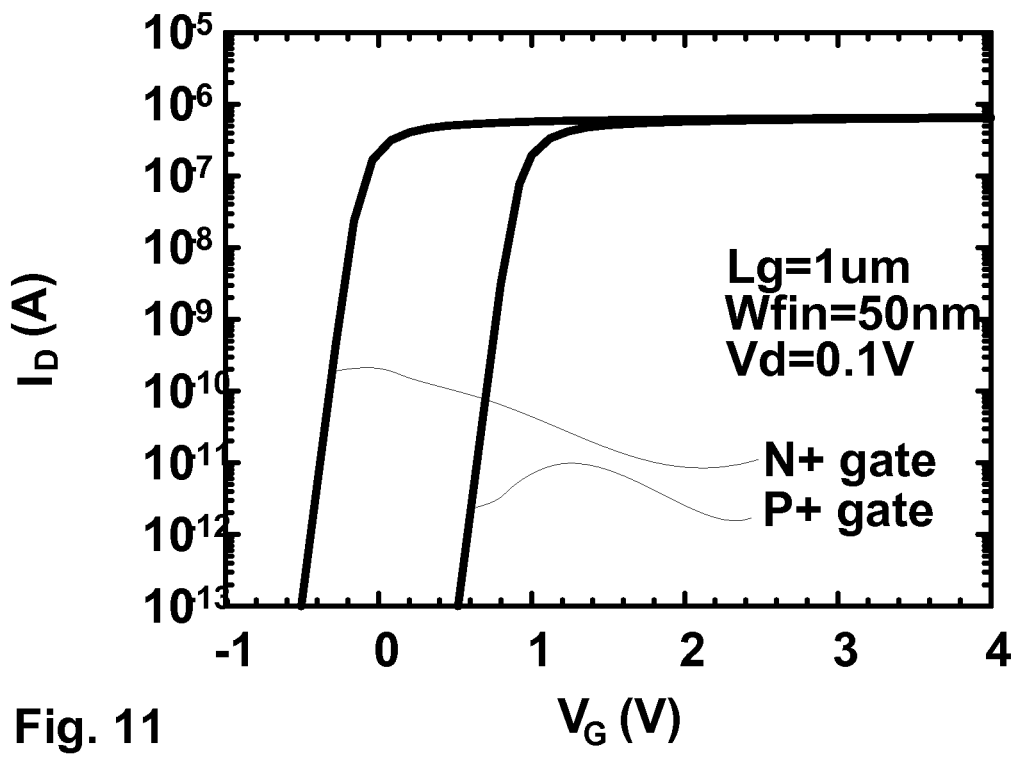
FIG. 11 is a gate voltage versus drain current graph illustrating simulation results of threshold voltage for embodiments of high-voltage finFET transistors.

FIG. 11 illustrates the results of simulation of a high-voltage finFET as described herein having an STI depth of about 0.5μ, and a fin height of about 0.5μ. The gate length in the simulated device was one micron, and in the fin width was 50 nm. Using an n+ polysilicon gate, the threshold voltage was about −0.23 V. Using a gate material of p+ polysilicon, the threshold shifts to about 0.79 V. This phenomena may be a result of finFET operation in a fully depleted mode, where the light p-well doping does not effectively control the threshold voltage. Thus, threshold voltage can be controlled using a higher work function gate material as illustrated by the simulation shown in FIG. 11.

Figure 12:
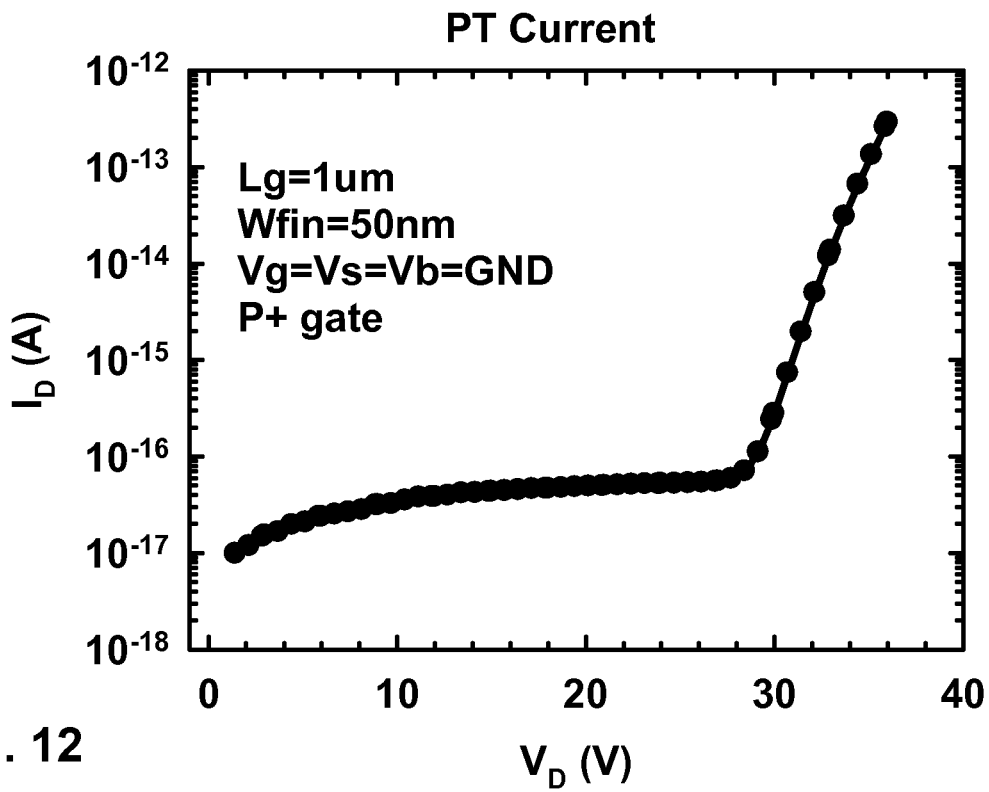
FIG. 12 is a drain voltage versus drain current graph illustrating simulation results of punch through current for embodiments of high-voltage finFET transistors.

FIG. 12 is a graph of results of a simulation showing drain current versus drain voltage, illustrating punch-through PT current without consideration of an impact ionization model, and without the enhanced p-type doping at the base of the fin. Using a fin with the 50 nm width, a gate length of one micron, and a p+ polysilicon gate, the simulation shows punch-through at a drain voltage of about 30 V, while the gate, source and body are grounded. In the real device, boron segregation and activation is expected to reduce the p-well doping near the STI structure. Thus, enhanced p-type doping at the base the fin will give better field isolation and improve punch-through performance.

Figure 13A:
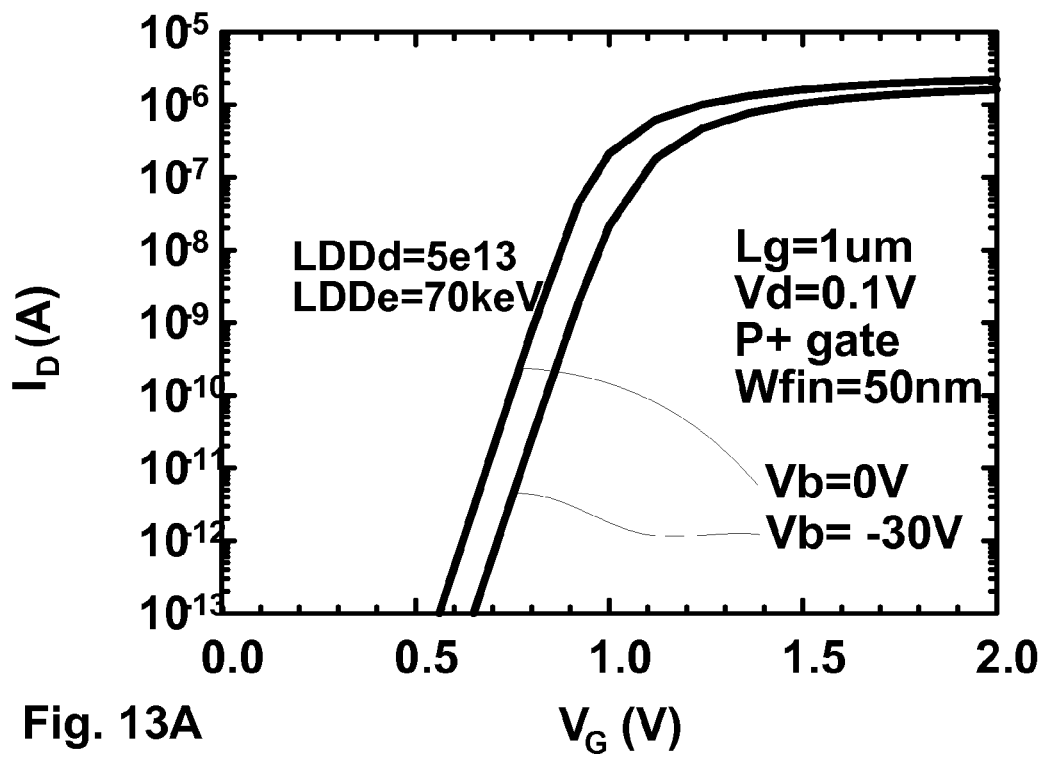
FIGS. 13A and 13B are gate current versus drain voltage graphs illustrating simulation results for body effect in embodiments of high-voltage finFET transistors.

FIG. 13A is a graph of results of a simulation showing drain current versus gate voltage, with traces for substrate voltage at 0 V and substrate voltage increased in magnitude to −30 V as labeled. In the simulation, the drain voltage was about 0.1 V. For the simulation, the dosage for the lightly doped region of the fin was 5E13/cm$^2$, and the energy of the implant was 70 keV. The dosage for the highly doped region of the source/drain terminal was 3E15/cm$^2$, and the energy for the implant was 20 keV. As illustrated, body effect even with a −30 V substrate is very small, causing a shift in threshold voltage of about 0.1 V.

Figure 13B:
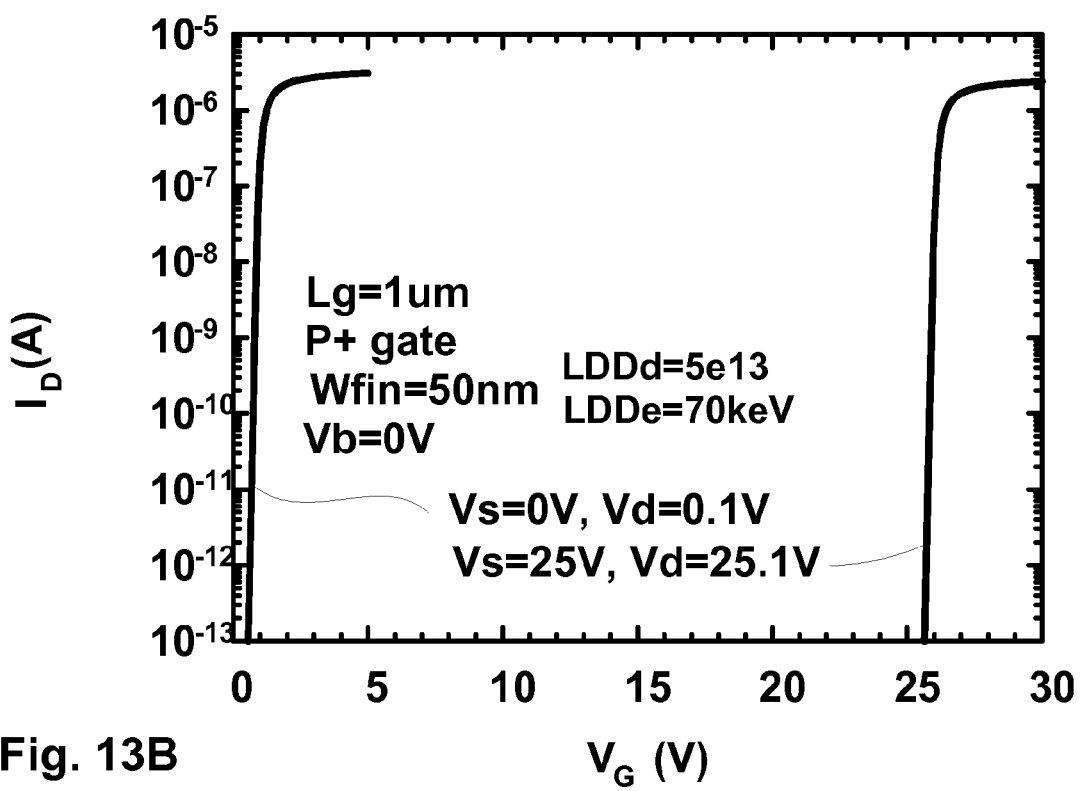

FIG. 13B is a graph of results of a simulation, of the same device configuration used for the simulation of FIG. 13A, showing drain current versus gate voltage, with traces for source bias at 0 V and raised to 25 V as labeled. For the low voltage trace, the drain voltage was set at 0.1 V. For the high-voltage trace, the drain voltage was set at 25.1 V. The threshold shift for these two traces was 25.08 V, which is essentially the same as the shift in source voltage.

Because of the smaller body effect on the high-voltage finFET, the gate voltage required to turn on the device (e.g. S1 in FIG. 7) can be lower than that of the planar MOSFET, reducing the maximum chip voltage required for turning on the high-voltage switch.

Also, simulations were conducted to determine the effective fin width, ranging from about 50 nm to about 500 nm on the body effect. It was demonstrated that wider fin width results in a stronger body effect, with fins with less than 100 nm having a body effect, for a −30 V substrate, causing a threshold voltage shift of less than 0.3 V, compared to the grounded substrate.

Figure 14:
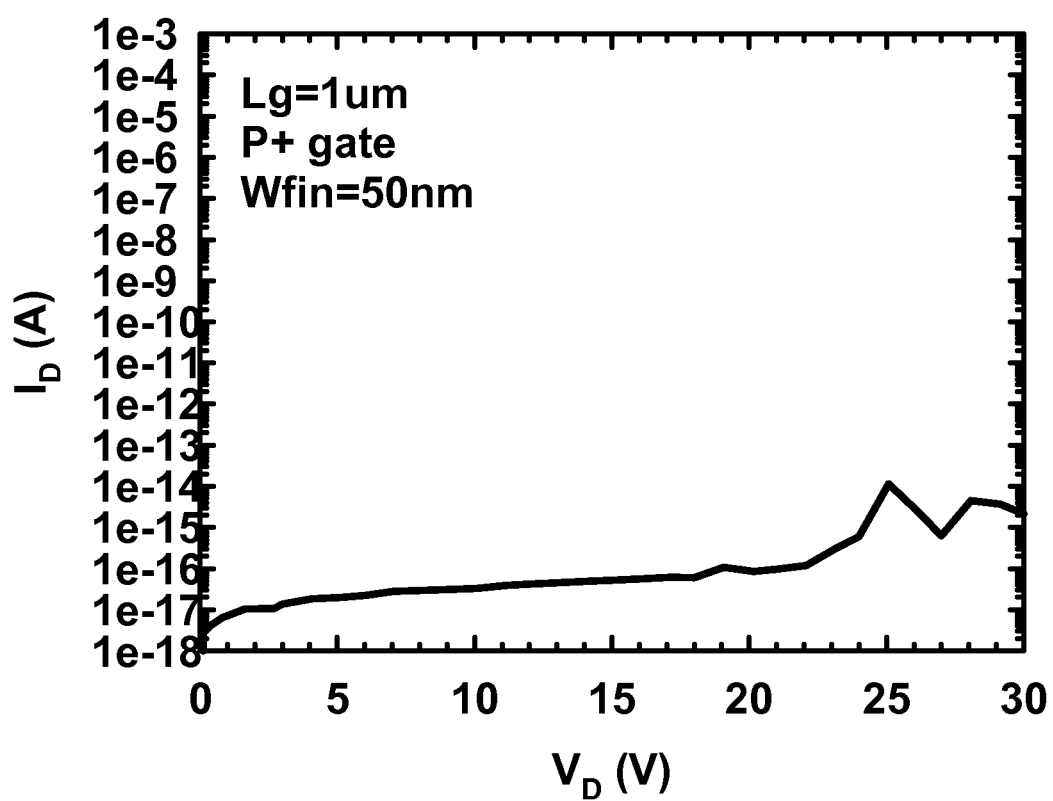
FIG. 14 is a graph of drain voltage versus drain current illustrating lack of breakdown below 30 V for embodiments of high-voltage transistors.

FIG. 14 is a graph of drain current versus drain voltage, considering impact ionization for a high-voltage finFET simulation, in which the dosage for the lightly doped region of the fin was 5E13/cm$^2$, and the energy of the implant was 70 keV, gate length was one micron, and the fin width was 50 nm using a p+ polysilicon gate. Simulation demonstrates that no breakdown occurred before and 30 V drain bias. Thus, the simulation demonstrates configurations of a finFET are demonstrated for high voltage circuits, with breakdown voltages of 30 V or more.

A high-voltage finFET device is described supporting voltages greater than 20 V, and in some embodiments greater than 30 V. A very tall fin height can be utilized as well as a very large STI depth, both of which can be on the order of 500 nm or more. This can greatly relax narrow-width effects of high-voltage devices and scale fin horizontal pitch below 0.5μ. This can reduce the layout area, compared to that of planar a high-voltage MOSFET configured for equivalent breakdown performance, by as much as six times. A more aggressive fin pitch can be accomplished as well, by utilizing taller fin height and deeper STI depths, allowing scaling of the layout as the scaling of associated circuitry such as memories also shrinks.

The high voltage finFETs are suitable for applications in peripheral circuitry for various NAND flash products, 3D NAND flash products, and other memory products. It is also applicable for use in any circuit requiring high voltage and layout critical scaling.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A high voltage transistor, comprising:
   a semiconductor fin;
   gate dielectric on first and second sides of the fin;
   a gate overlying the gate dielectric and a channel region in the fin on the first and second sides; and
   a source terminal and a drain terminal in the fin on opposing sides of the gate, the transistor having a breakdown voltage of 30 Volts or greater,
   wherein the source terminal includes a lightly doped region adjacent the channel region and a more heavily doped region, and the drain terminal includes a lightly doped region adjacent the channel region and a more heavily doped region, both the lightly doped regions extending along the fin away from the gate by more than 0.5 microns, where the lightly doped regions have dopant concentration less than that of the more heavily doped region, and wherein the channel region in the fin has a doping concentration in the channel region, and extends from a semiconductor substrate having a doping concentration at an intersection of the fin with the substrate that is greater than that of the channel region.

2. The transistor of claim 1, wherein the fin has a width in the channel region, between the first and second sides of less than 0.1 microns.

3. The transistor of claim 1, wherein the gate has a width, parallel to the fin, that is greater than 0.5 microns.

4. The transistor of claim 1, wherein the fin has a first width in the channel region, between the first and second sides, a width transition region in which the width increases, and a wider region, the wider region including source/drain contacts contacting the fin in the wider region.

5. The transistor of claim 1, wherein the fin has a first width in the channel region, between the first and second sides, a width transition region less than 0.5 microns away from the gate in which the width increases, and a wider region, the wider region including source/drain contacts contacting the fin in the wider region.

6. The transistor of claim 5, including more highly doped, source/drain contacts contacting the fin in the wider region.

7. The transistor of claim 1, wherein the gate comprises a material having a work function higher than n+ polysilicon.

8. The transistor of claim 1, including an insulating cap on the fin beneath the gate, having an effective thickness greater than the gate dielectric.

9. An integrated circuit, comprising:
   a circuit configured to provide voltages higher than 20 V to circuit elements on the integrated circuit, the circuit including a switch comprising:
      a semiconductor fin;
      gate dielectric on first and second sides of the fin; and
      a gate overlying the gate dielectric and a channel region in the fin on the first and second sides; and
   a source terminal and a drain terminal in the fin on opposing sides of the gate, the drain terminal being connected to a particular circuit element, and the source terminal having a voltage level set by the circuit;
   wherein the source terminal includes a lightly doped region adjacent the channel region and a more heavily doped region, and the drain terminal includes a lightly doped region adjacent the channel region and a more heavily doped region, both the lightly doped regions extending along the fin away from the gate by more than 0.5 microns, where the lightly doped regions have dopant concentration less than that of the more heavily doped region, and wherein the channel region in the fin has a doping concentration in the channel region, and extends from a semiconductor substrate having a doping concentration at an intersection of the fin with the substrate that is greater than that of the channel region.

10. The integrated circuit of claim 9, wherein the switch is configured to have a breakdown voltage of 30 Volts or greater.

11. The integrated circuit of claim 9, wherein the fin has a width in the channel region, between the first and second sides of less than 0.1 microns.

12. The integrated circuit of claim 9, wherein the gate has a width, parallel to the fin, that is greater than 0.5 microns.

13. The integrated circuit of claim 9, wherein the fin has a first width in the channel region, between the first and second sides, a width transition region in which the width increases, and a wider region, the wider region including source/drain contacts contacting the fin in the wider region.

14. The integrated circuit of claim 9, wherein the fin has a first width in the channel region, between the first and second sides, a width transition region less than 0.5 microns away from the gate in which the width increases, and a wider region, the wider region including source/drain contacts contacting the fin in the wider region.

15. The integrated circuit of claim 9, wherein the gate comprises a material having a work function higher than n+ polysilicon.

16. The integrated circuit of claim 9, including an insulating cap on the fin beneath the gate, having an effective thickness greater than the gate dielectric.

17. The integrated circuit of claim 9, comprising:
   a 3D memory array including a plurality of memory blocks arrayed on a substrate, and the circuit elements comprise word lines in the plurality of blocks.

18. The integrated circuit of claim 17, wherein the circuit includes a plurality of switches distributed in layout among the memory blocks.

19. The integrated circuit of claim 9, the circuit further including a source of voltage of 20 Volts or greater connected to the transistor.

20. A circuit comprising a high voltage transistor, the transistor comprising:
   a semiconductor fin;
   gate dielectric on first and second sides of the fin;
   a gate overlying the gate dielectric and a channel region in the fin on the first and second sides; and
   a source terminal and a drain terminal in the fin on opposing sides of the gate, the transistor having a breakdown voltage of 30 Volts or greater,
   wherein the source terminal includes a lightly doped region adjacent the channel region and a more heavily doped region, and the drain terminal includes a lightly doped region adjacent the channel region and a more heavily doped region, both the lightly doped regions extending along the fin away from the gate by more than 0.5 microns, where the lightly doped regions have dopant concentration less than that of the more heavily doped region,
   wherein the fin has a first width in the channel region, between the first and second sides, a width transition region in which the width increases, and a wider region, the wider region including source/drain contacts contacting the fin in the wider region.

21. The circuit of claim 20, the transistor including more highly doped, source/drain contacts contacting the fin in the wider region.

22. The circuit of claim 20, wherein the width transition region begins less than 0.5 microns away from the gate.

23. The circuit of claim 20, including a source of voltage of 20 Volts or greater connected to the transistor.

* * * * *